United States Patent
Hara

(10) Patent No.: US 7,821,617 B2
(45) Date of Patent: *Oct. 26, 2010

(54) EXPOSURE APPARATUS AND DEVICE MANUFACTURING METHOD

(75) Inventor: Hiromichi Hara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 652 days.

This patent is subject to a terminal disclaimer.

(21) Appl. No.: 11/688,370

(22) Filed: Mar. 20, 2007

(65) Prior Publication Data

US 2007/0160356 A1      Jul. 12, 2007

Related U.S. Application Data

(62) Division of application No. 11/190,898, filed on Jul. 28, 2005, now Pat. No. 7,227,617.

(30) Foreign Application Priority Data

Jul. 29, 2004 (JP) .............................. 2004-221495

(51) Int. Cl.
 *G03B 27/42* (2006.01)
 *G03B 27/54* (2006.01)
 *G03B 27/58* (2006.01)
 *G03B 27/32* (2006.01)

(52) U.S. Cl. .............................. 355/53; 355/67; 355/72; 355/77

(58) Field of Classification Search .................... 355/53, 355/67, 72, 75, 77; 378/34, 35
See application file for complete search history.

(56) References Cited

U.S. PATENT DOCUMENTS

| 5,881,987 | A | 3/1999 | Hara | 248/550 |
|---|---|---|---|---|
| 6,014,421 | A | 1/2000 | Chiba et al. | 378/34 |
| 6,493,062 | B2 | 12/2002 | Tokuda et al. | 355/53 |
| 6,538,720 | B2 * | 3/2003 | Galburt et al. | 355/53 |
| 6,545,745 | B2 | 4/2003 | Haney et al. | 355/30 |
| 6,885,431 | B2 | 4/2005 | Hara | 355/53 |
| 6,897,939 | B2 | 5/2005 | Hara | 355/53 |
| 6,914,663 | B2 | 7/2005 | Hara | 355/30 |
| 7,126,664 | B2 | 10/2006 | Luttikhuis et al. | 355/30 |
| 7,227,617 | B2 * | 6/2007 | Hara | 355/53 |
| 2005/0213060 | A1 | 9/2005 | Duisters et al. | 355/30 |

FOREIGN PATENT DOCUMENTS

JP        9-298142        11/1997

* cited by examiner

*Primary Examiner*—Alan A Mathews
(74) *Attorney, Agent, or Firm*—Fitzpatrick, Cella, Harper & Scinto

(57) ABSTRACT

An apparatus that includes an exposure system for exposing a substrate to an energy pattern, a vacuum chamber having an outside wall including first and second units which can be separated from each other, and a first anti-vibration mount being supported by the first unit, and for supporting a first constituent element of the exposure system. The first anti-vibration mount is disposed outside the vacuum chamber. The apparatus further includes a second anti-vibration mount, being supported by the second unit, for supporting a second constituent element of the exposure system.

25 Claims, 7 Drawing Sheets

EXPOSURE APPARATUS AND DEVICE MANUFACTURING METHOD

This application is a divisional application of U.S. patent application Ser. No. 11/190,898, filed Jul. 28, 2005 now U.S. Pat. No. 7,227,617.

FIELD OF THE INVENTION AND RELATED ART

This invention relates to an apparatus having an exposure system for exposing a substrate to an energy pattern, and also to a device manufacturing method using such an apparatus.

In the manufacture of microdevices, such as semiconductor devices (e.g., semiconductor integrated circuits), micromachines, or thin-film magnetic heads, for example, having extraordinarily fine patterns, exposure light (hereinafter, this term will be used as a generic term referring to visible light, ultraviolet light, EUV (extreme ultraviolet) light, X-rays, an electron beam, a charged particle beam, etc.) is projected as exposure energy onto a semiconductor wafer (substrate to be exposed) through a mask (original). The projection is carried out with or without a projection system comprising a projection lens (hereinafter, this term will be used as a generic term referring to a dioptric lens, a catoptric lens, a catadioptric lens system, a charged-particle lens, etc.), and a desired pattern is formed on the substrate thereby.

For the manufacture of semiconductor devices, masks corresponding to circuit patterns to be formed are prepared. Exposure light is projected onto a semiconductor wafer having a resist coating formed thereon, through a mask, whereby a circuit pattern of the mask is transferred to the wafer. After that, the wafer having the circuit pattern transferred thereto is developed. Also, after that, an etching process and a film forming process are carried out. The procedure, including an exposure process, is carried out repeatedly, whereby a desired circuit is produced on the semiconductor wafer. When such a mask is not used, and a circuit pattern is directly drawn upon a resist by means of an electron beam scan, for example, a similar procedure is carried out and a desired circuit pattern is formed on a semiconductor wafer.

Japanese Laid-Open Patent Application, Publication No. 09-298142, discloses an exposure apparatus in which EUV (extreme ultraviolet) light having an emission spectrum in the 5 to 15 nm wavelength region (soft X-ray region) is used as exposure light. Hereinafter, such an apparatus will be referred to as an EUV exposure apparatus.

In such an EUV exposure apparatus, the environment surrounding a light path that includes at least one of an illumination light path from a light emission source of EUV light to a mask and an exposure light path from the mask to a wafer, keeps a vacuum ambience. Although the following explanation will be made of an EUV exposure apparatus, the present invention is applicable also to electron beam exposure or charged-particle beam exposure, such as ion beam exposure, wherein the environment surrounding the exposure light path should keep a vacuum ambience, as in EUV exposure.

The EUV exposure apparatus generally comprises an exposure structure that includes a mask stage for holding a mask (or reticle) as an original, a substrate stage for holding a wafer as a substrate, a projection system, a mask stage base table for supporting the mask stage, and a substrate stage base table for supporting the substrate stage, for example. The exposure structure itself is supported by the floor (base structure) through an anti-vibration system, for example. A very heavy vacuum chamber is supported by the floor while surrounding a portion of or the whole of the exposure structure, so as to provide a vacuum ambience in the environment surrounding the exposure light path.

The EUV exposure apparatus needs the use of a very heavy vacuum chamber as described above. This causes inconveniences that the assembling, disassembling, and conveyance of the same are difficult, and it takes a very long time.

SUMMARY OF THE INVENTION

It is an object of the present invention to provide a novel and an improved apparatus, including an exposure system, for exposing a substrate to an energy pattern in a vacuum ambience.

In accordance with an aspect of the present invention, there is provided an apparatus comprising an exposure system for exposing a substrate to an energy pattern, a vacuum chamber having an outside wall including first and second units which can be separated from each other, a first anti-vibration mount being supported by the first unit, and for supporting a first constituent element of the exposure system, and a second anti-vibration mount being supported by the second unit, and for supporting a second constituent element of the exposure system.

In accordance with another aspect of the present invention, there is provided a device manufacturing method, comprising the steps of exposing a substrate to an energy pattern by use of an apparatus as recited above, developing the exposed substrate, and processing the developed substrate for production of a device.

These and other objects, features and advantages of the present invention will become more apparent upon consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings. The following description will be made with respect to an example of an exposure apparatus wherein an original is a reticle and a substrate to be exposed is a wafer.

Embodiment 1

Figure 1:
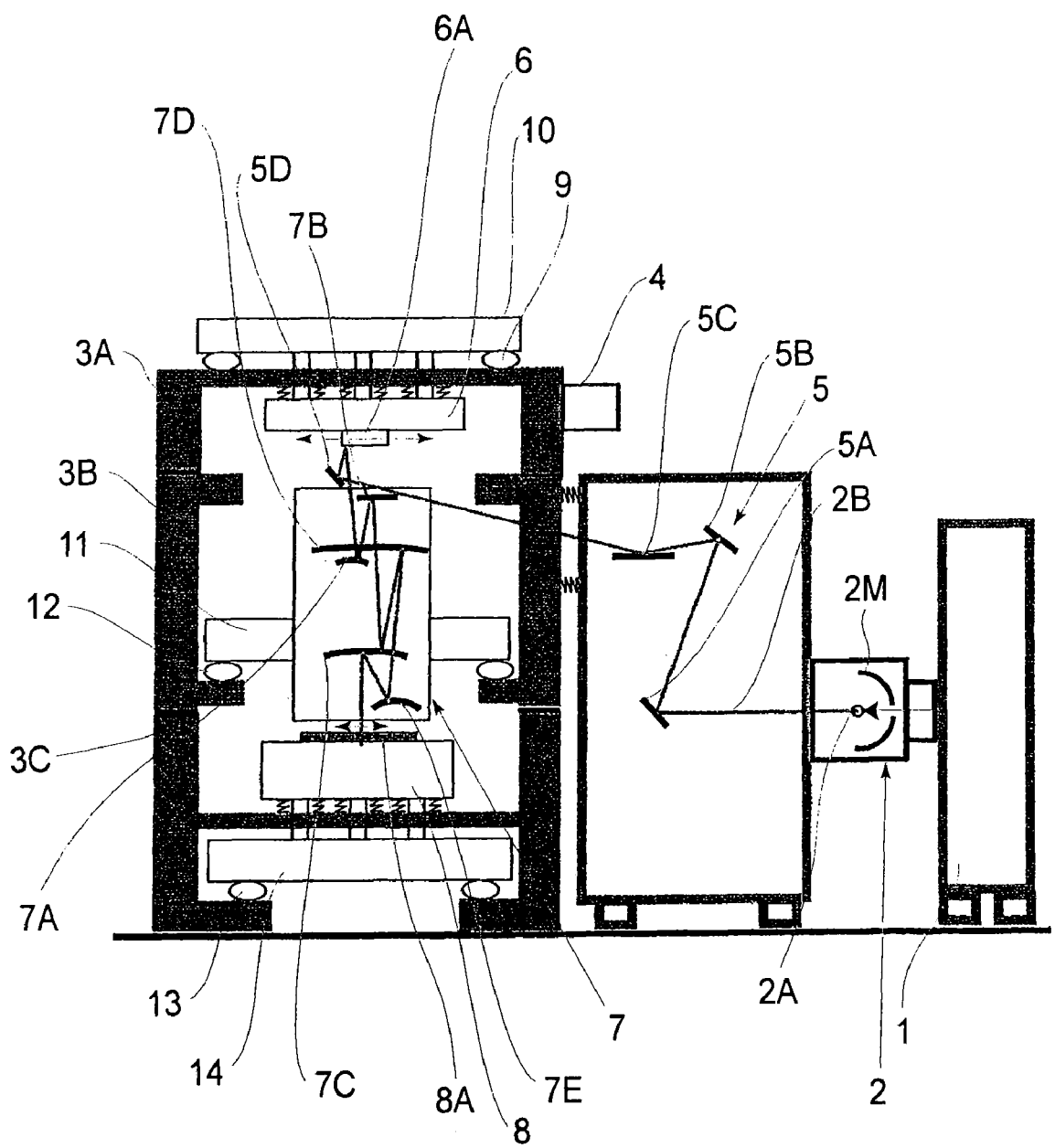
FIG. 1 is a schematic view of an exposure apparatus according to a first embodiment of the present invention.
Figure 2:
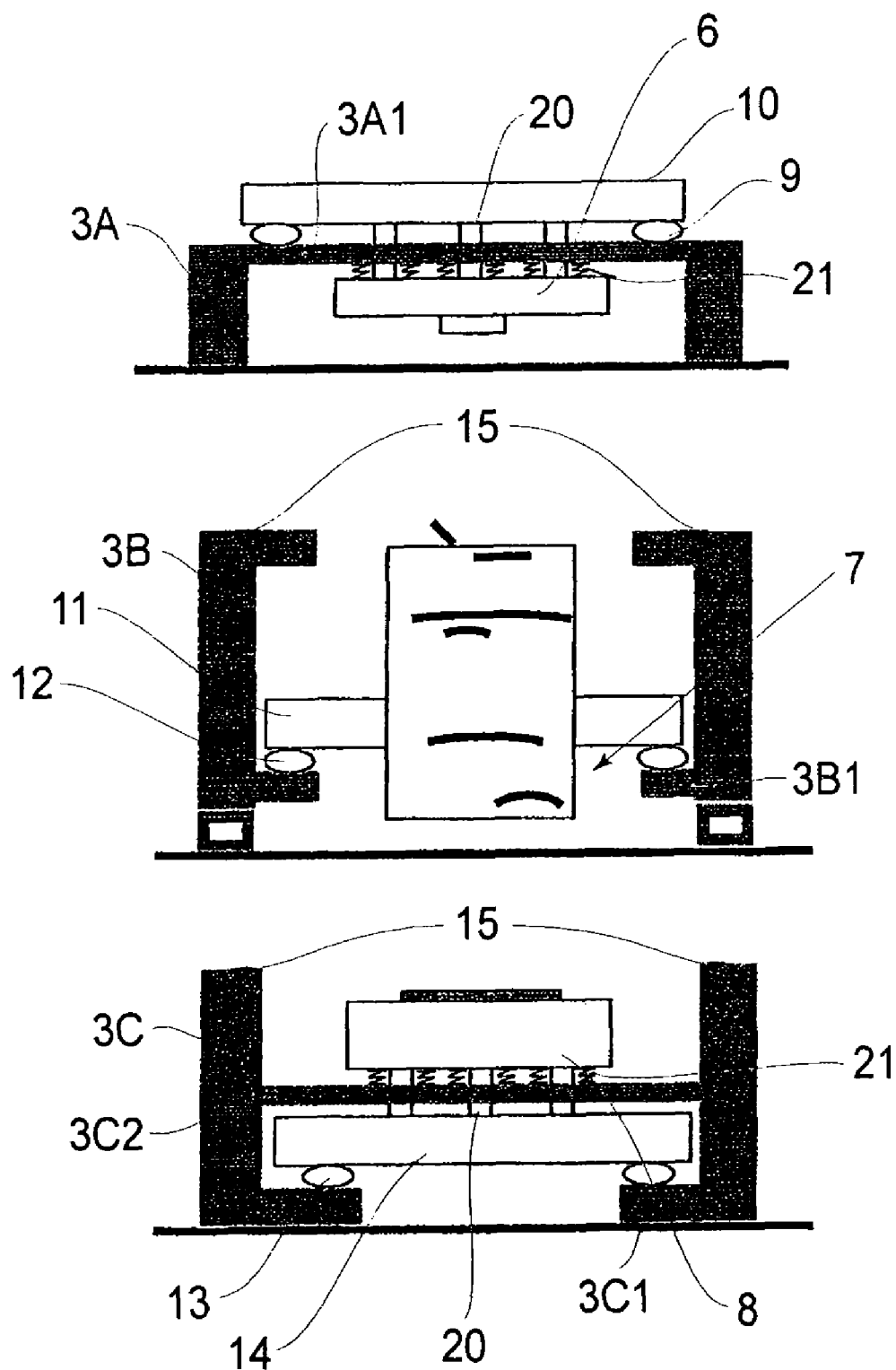
FIG. 2 is a schematic view for explaining a vacuum chamber structure according to the first embodiment of the present invention, wherein the vacuum chamber structure comprises modules that are able to be split.

FIG. 1 is a schematic view of a general structure of an exposure apparatus according to a first embodiment of the present invention. Denoted at 1 in FIG. 1 is an excitation laser light source, in which laser light is projected toward a point where a light source material that can produce a light emission point of a light source is gasified or liquefied, or it is provided as a sprayed gas, whereby atoms of the light source material are plasma excited and EUV (extreme ultraviolet) light is emitted. In this embodiment, the excitation laser light source 1 comprises a YAG solid laser light source, for example.

Denoted at 2 is a light-source light emitting unit, and it has a structure for keeping a vacuum inside thereof. Here, denoted at 2A is a light source, and it represents an actual light emission point. There is a light source mirror 2M around the light source 2A, and it functions to collectively reflect spherical light rays from the light source 2A while registering their emission directions to thereby produce exposure light. The light source mirror 2M is a semi-spherical mirror disposed around the light source 2A position. Liquefied Xe, a spray of liquefied Xe, or a Xe gas as a light emitting element from a nozzle (not shown), is provided at the light source 2A position.

Denoted at 3A, 3B and 3C is a vacuum chamber (chamber segments) as an environment chamber. The whole vacuum chamber that consists of a module structure having a combination of these three chamber segments functions to accommodate the whole of an exposure apparatus therein. Denoted at 4 is a vacuum pump, which serves to vacuum evacuate the inside of each vacuum chamber 3A, 3B and 3C to keep a vacuum state therein. Denoted at 5 is an exposure light introducing means for introducing and keeping exposure light 2B from the light-source light emitting unit 2. The exposure light source introducing means 5 comprises mirrors 5A-5D for homogenizing and shaping the exposure light 2B.

Denoted at 6 is a reticle (original) stage having a movable portion on which a reflection type reticle (mask) 6A, which is a reflective original of an exposure pattern, is mounted. Denoted at 7 is a projection optical system (projection system) that comprises a reduction mirror projection system. The projection optical system functions to project a pattern formed on the original (reticle) 6A onto a wafer 8A in a reduced scale, with the use of exposure light. In this reduction projection mirror optical system 7, the exposure light is reflected by mirrors 7A, 7B, 7C (original 6A side surface thereof), 7D, 7E, and 7C (wafer 8 side surface thereof), in this order, and finally, an image of the exposure pattern is projected in a reduced scale, at a predetermined reduction magnification ratio.

The mirrors 5A-5D of the exposure light introducing means for introducing and shaping the exposure light 2B from the light-source light emitting unit 2, as well as the mirrors 7A-7E of the reduction projection mirror optical system 7, have a reflection surface with a Mo—Si multilayered film formed thereon by vapor deposition or sputtering. With these reflection surfaces, the exposure light from the light source is reflected.

Denoted at 8 is a wafer (substrate) stage, and a wafer (substrate) 8A is mounted thereon. The wafer 8A is a Si substrate to be exposed by an image of the exposure pattern of the reticle 6A, as being projected reflectively and in a reduced scale. The wafer stage 8 is arranged to be position-controlled with respect to six freedoms of X, Y and Z axial directions, tilt directions ($\omega x$ and $\omega y$) about the X and Y axes, and a rotational direction ($\theta$) about the Z axis, for positioning the wafer 8A with respect to a predetermined exposure position.

The reticle stage 6 is suspended from a reticle stage mount base table 10, and this base table 10 is supported by a reticle mount 9, which functions as an anti-vibration mechanism and is provided on the vacuum chamber 3A.

The reticle stage mount (anti-vibration mechanism) 9 includes a damper or an actuator using air (a gas), as will be described later. The mount 9 is supported at the top of the vacuum chamber 3A, and it functions to isolate the reticle stage 6, the reticle stage mount base table 10 and the vacuum chamber 3A from each other with respect to vibration.

The reduction projection mirror optical system 7 has a barrel, which is held by a projection system mount base table 11. This base table 11 is supported through a projection system mount 12, which is provided inside the vacuum chamber 3B and which functions as an anti-vibration mechanism.

The projection system mount (anti-vibration mechanism) 12 includes a damper or an actuator using air (a gas), as will be described later. The projection mount 12 is supported by a supporting member provided inwardly at the side wall of the vacuum chamber 3B, and it functions to isolate the projection mount base table 11 and the vacuum chamber 3B from each other with respect to vibration.

A wafer stage mount base table 14 holds the wafer stage 8 thereon, and it is supported through a wafer stage mount 13, which is provided inside the vacuum chamber 3C and which functions as an anti-vibration mechanism.

The wafer stage mount (anti-vibration mechanism) 13 includes a damper or an actuator using air (a gas), as will be described later. The wafer stage mount 13 is supported by a supporting member 3C1 provided at a lower end of a downwardly extended portion of the side wall of the vacuum chamber 3C. It functions to isolate the wafer stage mount base table 14 and the vacuum chamber 3C from each other with respect to vibration.

As shown in FIG. 1, the reticle stage 6 (and/or reticle stage mount base table 10), the reduction projection mirror optical system 7 (and/or projection system mount base table 11), and the wafer stage 8 (and/or wafer stage mount base table 14) are supported by the vacuum chambers 3A-3C, while being isolated from these chambers with respect to vibration, by means of the reticle stage mount 9, the projection mount 12 and the wafer stage mount 13, respectively. Furthermore, the reticle stage 6 (and/or reticle stage mount base table 10), the reduction projection mirror optical system 7 (and/or projection system mount base table 11), and the wafer stage 8 (and/or wafer stage mount base table 14) are supported separately and independently from each other by means of the reticle stage mount 9, the projection system mount 12 and the wafer stage mount 13, respectively, such that they are isolated from each other with respect to vibration.

The reticle stage mount 9, the projection system mount 12 and the wafer stage mount 13 have a function for isolating the reticle stage mount table 10 of the reticle stage 6, the reduction projection mirror optical system 7 and the wafer stage mount base table 14 of the wafer stage 8, respectively, against vibrations from the vacuum chambers 3A-3B. The reticle stage mount 9 and the wafer stage mount 13 may be arranged to control its damper or actuator using an air spring, inside thereof, so as to dampen the vibration of the reticle stage mount base table 10 to be produced by motion of the reticle stage 6 or the vibration of the wafer stage mount base table 14 to be produced by motion of the wafer stage 8.

The exposure apparatus shown in FIG. 1 is arranged so that, when an image of the pattern of the mask 6A is projected through the reduction projection mirror optical system 7 onto a region upon the wafer 8A for exposure thereof, the reticle stage 6 and the wafer stage 8 are moved in a direction of an arrow in the drawing in synchronism with each other, to perform scan exposure. Furthermore, since, in this apparatus, different regions on the wafer 8A are exposed sequentially while repeating step motion and scan exposure, generally, it is called a "step-and-scan type".

Referring now to FIGS. 2-5, a vacuum chamber structure, which is able to be split based on a module structure, will be explained in detail.

In this embodiment, the main assembly of the exposure apparatus can be divided into plural modules. Namely, the vacuum chamber 3A is a module for accommodating the reticle stage 6 therein. The vacuum chamber 3B is a module for accommodating the reduction projection mirror optical system 7 therein. The vacuum chamber 3C is a module for accommodating the wafer stage 8 therein.

The reticle stage mount base table 10 is supported in an atmosphere by means of the reticle stage mount 9, which is provided on the vacuum chamber 3A. The reticle stage 6 is suspended in a vacuum from the reticle stage mount base table 10 by means of supporting members 20 extending through a top plate 3A1 of the vacuum chamber 3A. A metal bellows 21 (made of a stainless steel, for example) is provided between each supporting member 20 and the vacuum chamber 3A, to keep the gas-tightness. The projection system mount base table 11 for holding the reduction projection mirror optical system 7 is supported in a vacuum by means of the projection system mount 12, provided on the supporting member 3B 1 of the vacuum chamber 3B. The wafer stage mount base table 14 is supported in the atmosphere by means of the wafer stage mount 13, which is provided on the supporting member 3C1 of the vacuum chamber 3C. The wafer stage 8 is supported in a vacuum by means of supporting members 20, extending through a partition wall 3C2 of the vacuum chamber 3C. A metal bellows 21 (made of a stainless steel, for example) is provided between each supporting member 20 and the vacuum chamber 3C, to keep the gas-tightness.

The modules accommodated in these vacuum chambers can be connected to each other while keeping the gas-tightness. At each coupling surface of these vacuum chambers, there is a sealing surface 15 for keeping the gas-tightness. The gas-tightness keeping mechanism may include an O-ring or a metal gasket 30, as shown in FIG. 5.

The modules are provided with a relative positioning mechanism. Each mechanism may comprise a positioning mechanism using a ball and a cone-shaped recess 32, such as shown in FIGS. 5A and 5B, for example.

Figure 5A:
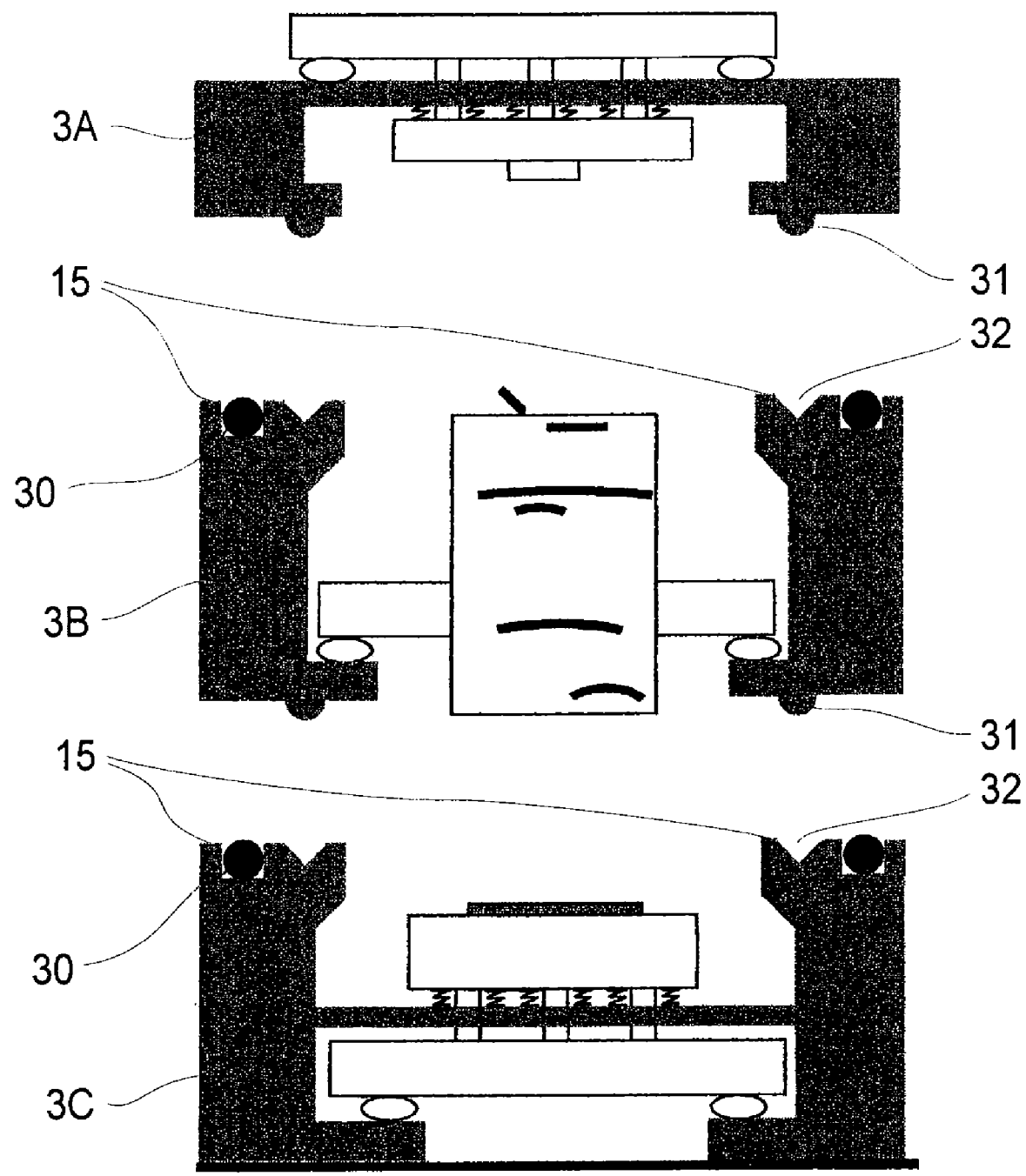
FIGS. 5A and 5B are schematic views, respectively, for explaining a seal structure according to the present invention.
Figure 5B:
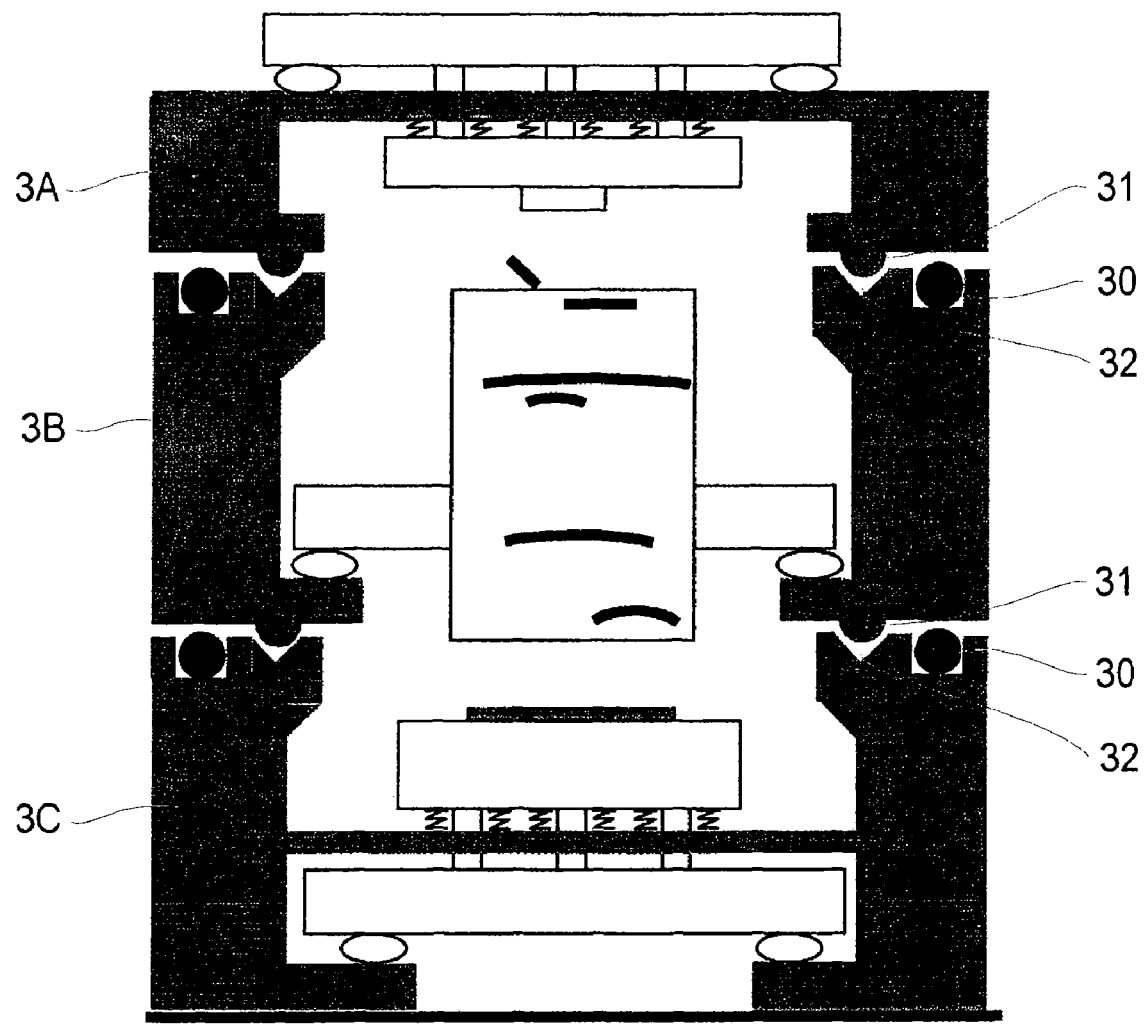

FIG. 5A illustrates the chambers as they are separated. FIG. 5B shows the chambers as combined.

Figure 3:
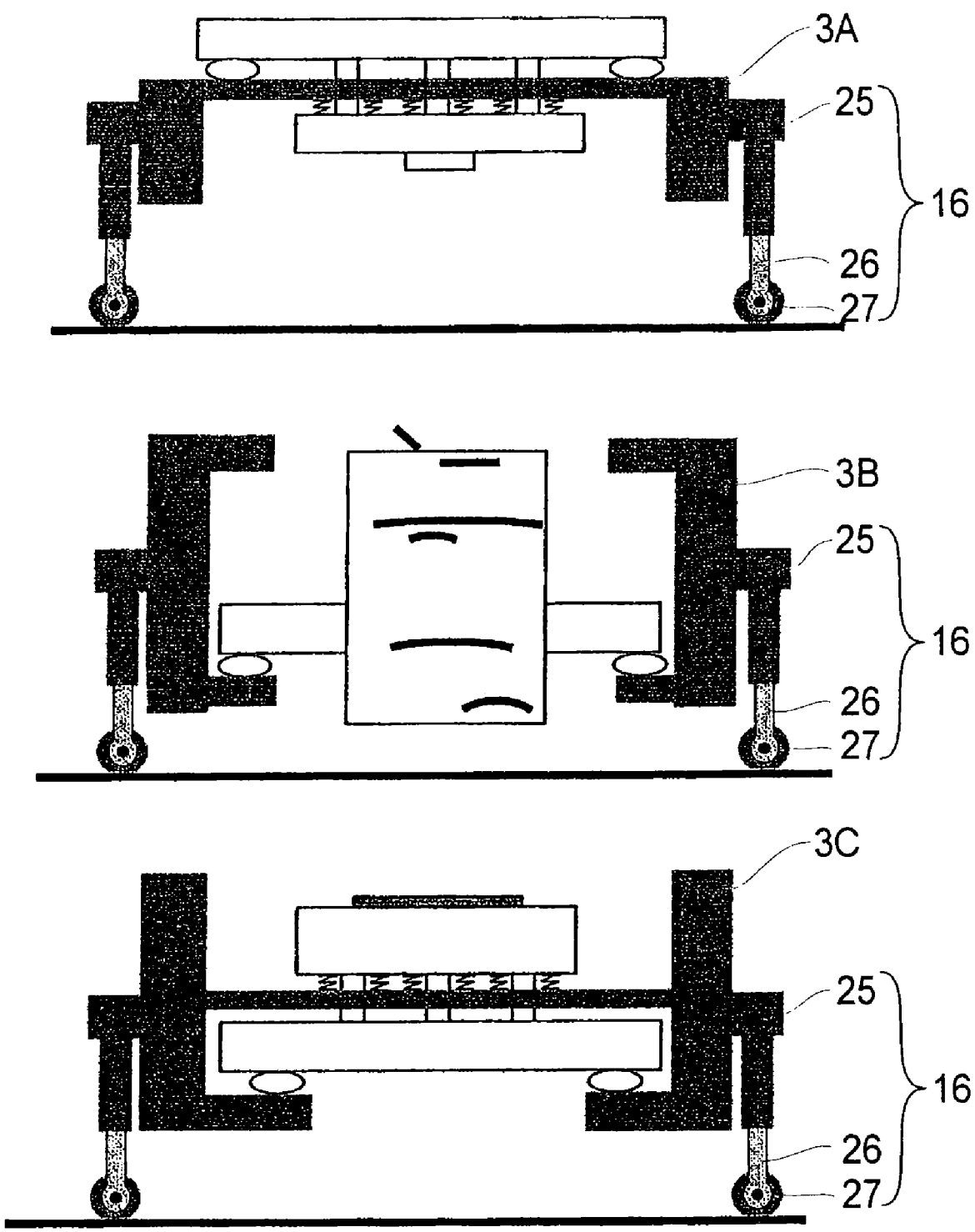
FIG. 3 is a schematic view for explaining a vacuum chamber structure according to the first embodiment of the present invention, wherein the vacuum chamber structure comprises modules, which are able to be split, with self-supported moving means, enabling self-supported motion.

Next, referring to FIG. 3, a vacuum chamber structure, which is able to be split based on a module structure and having self-supported moving means being movable in a self-supported state, will be explained in detail.

Each of the modules accommodated in the vacuum chambers is provided with self-supported moving means 16 being movable in a self-supported state. With this arrangement, for assembling of the exposure apparatus, each module can be separated and moved easily. Each self-supported moving mechanism (self-supported moving means) 16 comprises hydraulic cylinders 25 connected to the outside surface of the side wall of the vacuum chamber 3A (3B or 3C), rods 26 movable relative to the cylinders 25, and air casters 27 provided at the lower ends of the rods 26.

Embodiment 2

Figure 4:
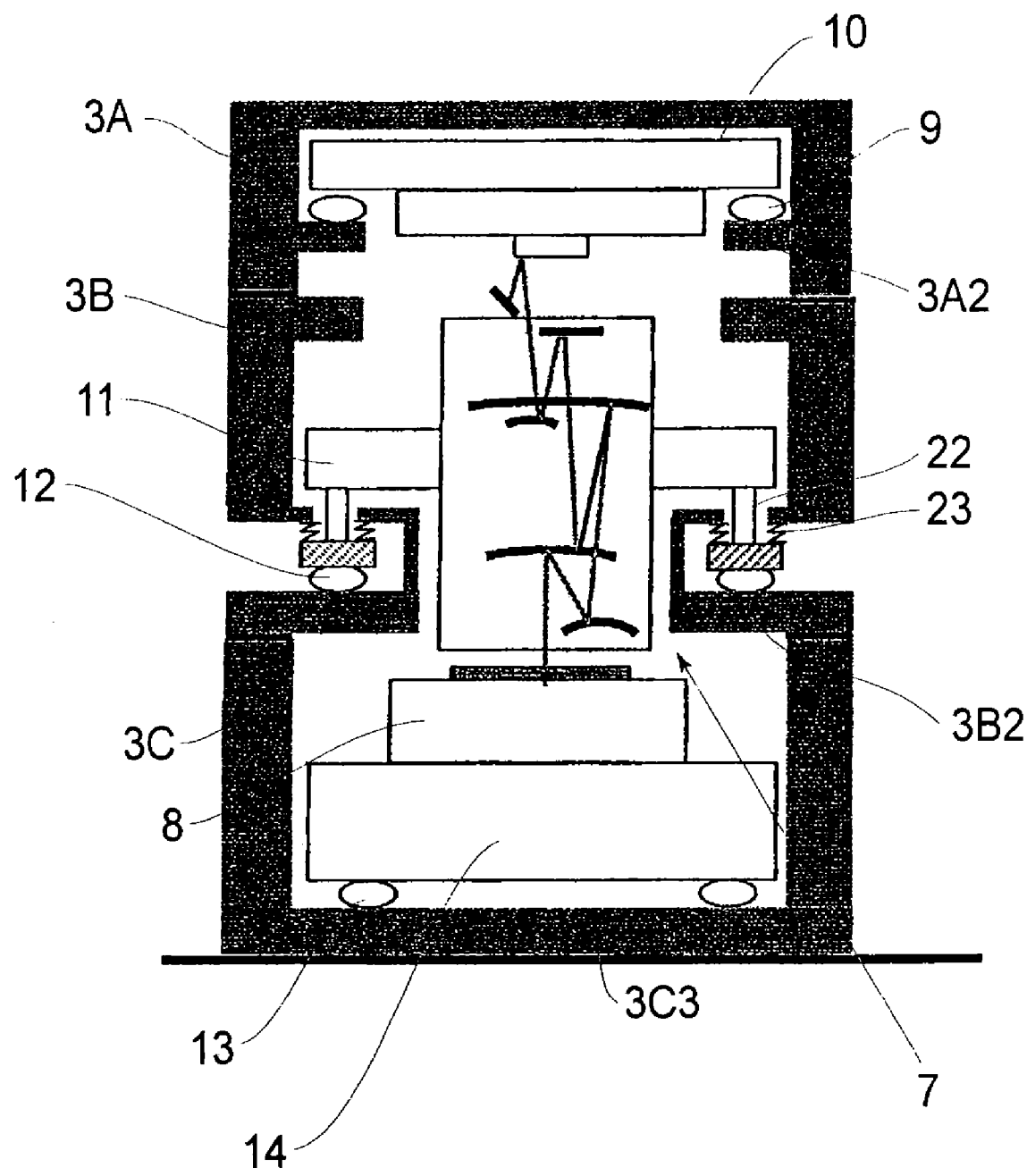
FIG. 4 is a schematic view for explaining a vacuum chamber structure according to a second embodiment of the present invention, wherein the vacuum chamber structure comprises modules that are able to be split.

FIG. 4 illustrates an exposure apparatus according to a second embodiment of the present invention.

In the first embodiment described above, the reticle stage mount base table 10 is supported in an atmosphere by means of the reticle stage mount 9 on the vacuum chamber 3A. The reticle stage 6 is suspended in a vacuum from the reticle stage mount base table 10 by means of supporting members 20 extending through the vacuum chamber 3A. A metal bellows 21 (made of a stainless steel, for example) is provided between each supporting member 20 and the vacuum chamber 3A, to keep the gas-tightness. The projection system mount base table 11 for holding the reduction projection mirror optical system 7 is supported in a vacuum by means of the projection system mount 12, provided on the vacuum chamber 3B. The wafer stage mount base table 14 is supported in the atmosphere by means of the wafer stage mount 13, which is provided on the vacuum chamber 3C. The wafer stage 8 is supported in a vacuum by means of supporting members 20 extending through the vacuum chamber 3C.

In the second embodiment, on the other hand, the reticle stage mount base table 10 is supported in a vacuum by means of a reticle stage mount 9 disposed on a supporting member 3A2, which is provided on the side wall of the vacuum chamber 3A. A projection system mount base table 11 that holds a reduction projection mirror optical system 7 is supported in a vacuum by means of a projection system mount 12, which is supported by a supporting member 3B2 at the lower end of the vacuum chamber 3B, and with the use of supporting members 22 extending through the vacuum chamber 3B. A metal bellows 23 (made of a stainless steel, for example) is provided between each supporting member 22 and the vacuum chamber 3B, to keep the gas-tightness. A wafer stage mount base table 14 is supported in a vacuum by means of a wafer stage mount 13, which is provided at the bottom 3C3 of the vacuum chamber 3C.

Embodiment 3

Next, an embodiment of a device manufacturing method, using an exposure apparatus according to one of the first and second embodiments described above, will be explained. The example will be described in conjunction with semiconductor device manufacture.

Figure 6:
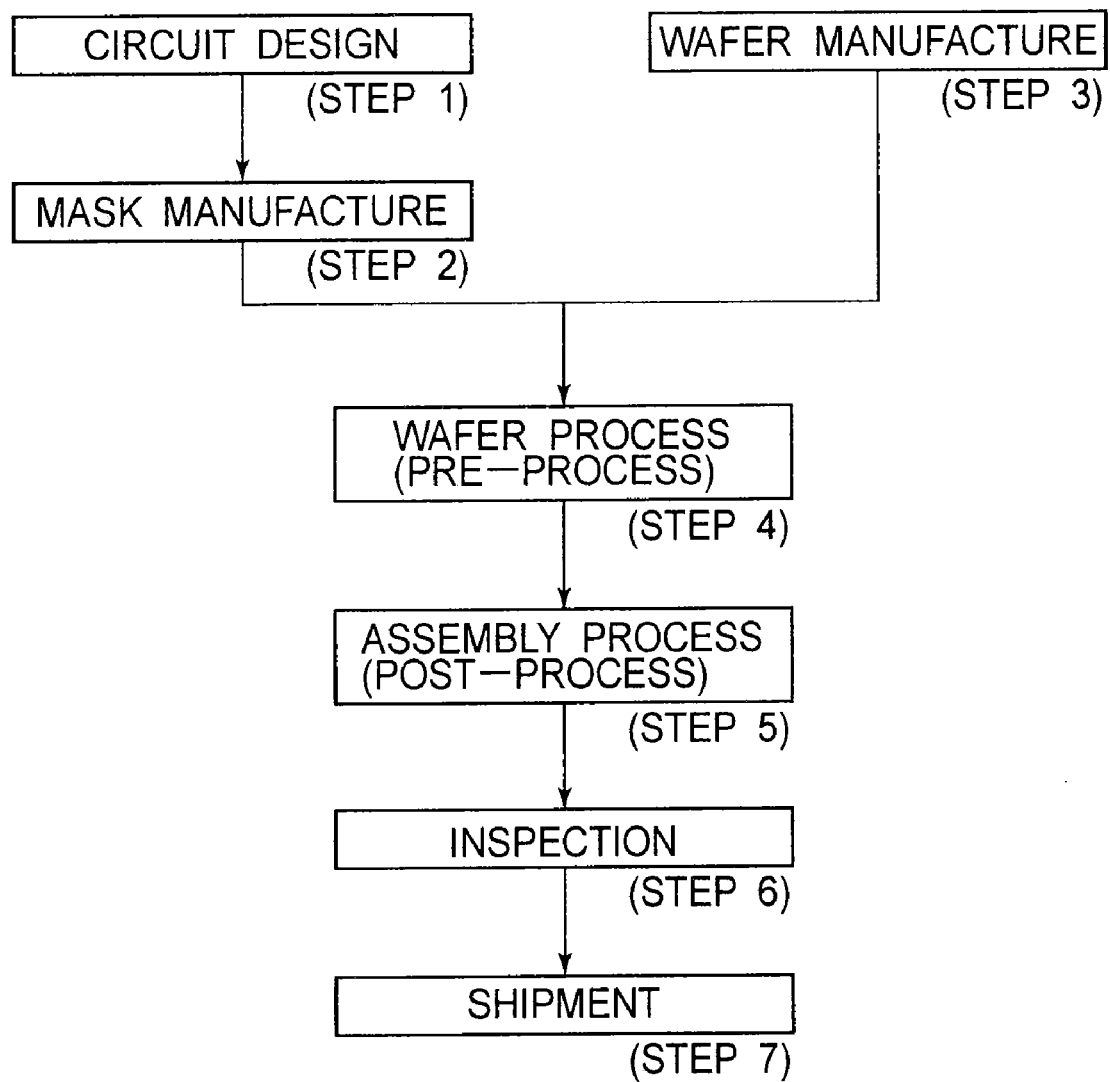
FIG. 6 is a flow chart for explaining semiconductor device manufacturing processes.

FIG. 6 is a flow chart for explaining the overall procedure for semiconductor device manufacture. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5, subsequent to this, is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

More specifically, the wafer process at step 4 described above includes (i) an oxidation process for oxidizing the surface of a wafer, (ii) a CVD process for forming an insulating film on the wafer surface, (iii) an electrode forming process for forming electrodes upon the wafer by vapor deposition, (iv) an ion implanting process for implanting ions to the wafer, (v) a resist process for applying a resist (photosensitive material) to the wafer, (vi) an exposure process for printing, by exposure, the circuit pattern of the mask on the wafer through the exposure apparatus described above, (vii) a developing process for developing the exposed wafer, (viii) an etching process for removing portions other than the developed resist image, and (ix) a resist separation process for separating the resist material remaining on the wafer after being subjected to the etching process. By repeating these processes, circuit patterns are superposedly formed on the wafer.

In accordance with the embodiments of the present invention as described above, the exposure apparatus can be assembled by parallel works made in relation to plural modules, respectively, and finally, these modules are combined into the apparatus. As a result, the time required for assembly can be reduced significantly. Also, for conveyance, each module can be conveyed. Thus, the time necessary for disassembling, as well as the weight to be conveyed, can be reduced. Further, the disassembling operation can be made simple, and chemical contamination can be suppressed easily.

Each module may be provided with an elevation mechanism, such as a hydraulic jack, and this makes it possible to further reduce the operation time for separating the exposure apparatus into modules.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-221495, filed Jul. 29, 2004, which is hereby incorporated by reference.

What is claimed is:

1. An exposure apparatus for transferring a pattern of an original onto a substrate by exposure, said apparatus comprising:
    an original stage configured to hold the original;
    a projection system configured to project the pattern of the original onto the substrate;
    a substrate stage configured to hold the substrate; and
    an accommodation chamber configured to accommodate therein said original stage, said projection system and said substrate stage, said accommodation chamber including a first chamber configured to support said original stage through an original stage mount member, a second chamber configured to support said projection system through a projection system mount member, and a third chamber configured to support said substrate stage through a substrate stage mount member,
    wherein said first chamber is able to be disengaged from said second chamber and to be recombined with said second chamber, and wherein said second chamber is able to be disengaged from said third chamber and to be recombined with said third chamber.

2. An apparatus according to claim 1, wherein said original stage mount member has an original base configured to support said original stage and an original mount provided between said first chamber and said original base to isolate vibration, wherein said projection system mount member has a projection system base configured to support said projection system and a projection system mount provided between said second chamber and said projection system base to isolate vibration, and wherein said substrate stage mount member has a substrate base configured to support said substrate stage and a substrate mount provided between said third chamber and said substrate base to isolate vibration.

3. An apparatus according to claim 1, further comprising seal members provided between said first and second chambers and between said second and third chambers.

4. An apparatus according to claim 1, further comprising positioning members provided between said first and second chambers and between said second and third chambers.

5. An apparatus according to claim 1, wherein at least one of said first, second and third chambers has a self-supported moving mechanism.

6. An apparatus according to claim 1, wherein at least one of said original stage mount member, said projection system mount member and said substrate stage mount member is disposed inside said accommodation chamber.

7. An apparatus according to claim 1, wherein at least one of said original stage mount member, said projection system mount member and said substrate stage mount member has a pneumatic-pressure type actuator.

8. An apparatus according to claim 1, wherein said exposure apparatus uses extreme ultraviolet light for the exposure.

9. An apparatus according to claim 1, wherein the inside of said accommodation chamber is maintained in a vacuum state.

10. An exposure apparatus for transferring a pattern of an original onto a substrate by exposure, said apparatus comprising:
    an original stage configured to hold the original;
    a projection system configured to project the pattern of the original onto the substrate;
    a substrate stage configured to hold the substrate;
    a chamber configured to accommodate therein said original stage, said projection system and said substrate stage;
    a base configured to support at least one of said original stage, said projection system and said substrate stage; and
    a mount provided between said chamber and said base to isolate vibration, said mount being disposed outside said chamber.

11. An apparatus according to claim 10, wherein said base is disposed outside said chamber and is configured to support one of said original stage and said substrate stage through a supporting member, said supporting member being disposed so as to extend through an opening formed on said chamber, and wherein a bellows is arranged to maintain the inside of said chamber in a gas-tight state relative to the outside of said chamber.

12. An apparatus according to claim 10, wherein said base is disposed inside said chamber, is configured to support said projection system and is connected to said mount through a supporting member, said supporting member being disposed so as to extend through an opening formed in said chamber, and wherein a bellows is arranged to maintain the inside of said chamber in a gas-tight state relative to the outside of said chamber.

13. An apparatus according to claim 10, wherein said mount has a pneumatic-pressure type actuator.

14. An apparatus according to claim 10, wherein said exposure apparatus uses extreme ultraviolet light for the exposure.

15. An apparatus according to claim 10, wherein the inside of said chamber is maintained in a vacuum state.

16. A device manufacturing method comprising:
(a) exposing a substrate to a pattern of an original, by an exposure light beam from an exposure apparatus, which comprises (i) an original stage configured to hold the original, (ii) a projection system configured to project the pattern of the original onto the substrate by the exposure light beam, to produce an exposed substrate, (iii) a substrate stage configured to hold the substrate, (iv) a chamber configured to accommodate therein the original stage, the projection system and the substrate stage, (v) a base configured to support at least one of the original stage, the projection system and the substrate stage, and (vi) a mount provided between the chamber and the base to isolate vibration, the mount being disposed outside the chamber;
(b) developing the exposed substrate to produce a developed substrate; and
(c) processing the developed substrate to manufacture the device.

17. An exposure apparatus for transferring a pattern of an original onto a substrate by exposure, said apparatus comprising:
an original stage configured to hold the original;
a projection system configured to project the pattern of the original onto the substrate;
a substrate stage configured to hold the substrate; and
an accommodation chamber configured to accommodate therein said original stage, said projection system and said substrate stage, said accommodation chamber including a first chamber configured to support said original stage through an original stage mount member, a second chamber configured to support said projection system through a projection system mount member, and a third chamber configured to support said substrate stage through a substrate stage mount member,
wherein (i) said original stage mount member has an original base configured to support said original stage and an original mount provided between said first chamber and said original base to isolate vibration, (ii) said projection system mount member has a projection system base configured to support said projection system and a projection system mount provided between said second chamber and said projection system base to isolate vibration, and (iii) said substrate stage mount member has a substrate base configured to support said substrate stage and a substrate mount provided between said third chamber and said substrate base to isolate vibration.

18. An apparatus according to claim 17, wherein at least one of said original stage mount member, said projection system mount member and said substrate stage mount member is disposed inside said accommodation chamber.

19. An apparatus according to claim 17, wherein at least one of said original stage mount member, said projection system mount member and said substrate stage mount member has a pneumatic-pressure type actuator.

20. An apparatus according to claim 17, wherein said exposure apparatus uses extreme ultraviolet light for the exposure.

21. An apparatus according to claim 17, wherein the inside of said accommodation chamber is maintained in a vacuum state.

22. An exposure apparatus for transferring a pattern of an original onto a substrate by exposure, said apparatus comprising:
an original stage configured to hold the original;
a projection system configured to project the pattern of the original onto the substrate;
a substrate stage configured to hold the substrate; and
an accommodation chamber configured to accommodate therein said original stage, said projection system and said substrate stage, said accommodation chamber including a first chamber configured to support said original stage through an original stage mount member, a second chamber configured to support said projection system through a projection system mount member, and a third member configured to support said substrate stage through a substrate stage mount member,
wherein each of said first, second and third chambers is able to be disengaged from the others, and position members are provided between said first and second chambers and between said second and third chambers.

23. An apparatus according to claim 22, wherein at least one of said first, second and third chambers has a self-supported moving mechanism.

24. An apparatus according to claim 22, further comprising seal members between said first and second chambers and between said second and third chambers.

25. A device manufacturing method comprising:
(a) exposing a substrate to a pattern of an original, by an exposure light beam from an exposure apparatus, which comprises (i) an original stage configured to hold the original, (ii) a projection system configured to project the pattern of the original onto the substrate by the exposure light beam, to produce an exposed substrate, (iii) a substrate stage configured to hold the substrate, and (iv) an accommodation chamber configured to accommodate therein the original stage, the projection system and the substrate stage, the accommodation chamber including a first chamber configured to support the original stage through an original stage mount member, a second chamber configured to support the projection system through a projection system mount member, and a third chamber configured to support the substrate stage through a substrate stage mount member, wherein the first chamber is able to be disengaged from the second chamber and to be recombined with the second chamber, and the second chamber is able to be disengaged from the third chamber and to be recombined with the third chamber;
(b) developing the exposed substrate to produced a developed substrate; and
(c) processing the developed substrate to manufacture a device.

* * * * *